United States Patent
Pomarede et al.

(10) Patent No.: US 7,026,219 B2
(45) Date of Patent: Apr. 11, 2006

(54) INTEGRATION OF HIGH K GATE DIELECTRIC

(75) Inventors: Christophe F. Pomarede, Phoenix, AZ (US); Michael E. Givens, Phoenix, AZ (US); Eric J. Shero, Phoenix, AZ (US); Michael A. Todd, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 10/074,722

(22) Filed: Feb. 11, 2002

(65) Prior Publication Data

US 2002/0173130 A1 Nov. 21, 2002

Related U.S. Application Data

(60) Provisional application No. 60/332,696, filed on Nov. 13, 2001, provisional application No. 60/279,256, filed on Mar. 27, 2001, and provisional application No. 60/268,337, filed on Feb. 12, 2001.

(51) Int. Cl.
*H01L 21/336* (2006.01)
*H01L 21/20* (2006.01)
*H01L 21/4763* (2006.01)
*H01L 21/469* (2006.01)

(52) U.S. Cl. .................. 438/285; 438/508; 438/585; 438/591; 438/785

(58) Field of Classification Search ............ 438/287, 438/785, 300, 151, 203, 320, 309, 508, 216, 438/585, 591
See application file for complete search history.

(56) References Cited

U.S. PATENT DOCUMENTS

| | | | |
|---|---|---|---|
| 3,900,597 A | 8/1975 | Chruma et al. | |
| 4,217,374 A | 8/1980 | Ovshinsky et al. | |
| 4,237,150 A | 12/1980 | Wiesmann | |

(Continued)

FOREIGN PATENT DOCUMENTS

| | | |
|---|---|---|
| EP | 0 368 651 A2 | 5/1990 |
| JP | 54-4066 | 1/1979 |
| JP | 57209810 A | 12/1982 |

(Continued)

OTHER PUBLICATIONS

Ikoma et al., Growth of Si/3C–SIC/Si(100) hetrostructures by pulsed supersonic free jets, Applied Physics Letters, vol. 75, No. 25, pp. 3977–3979, Dec. 1999.

Angermeier et al., "Initial growth processes in the epitaxy of Ge with $GeH_4$ on oxidized Si substrates," *J. Electrochem. Soc.*, vol. 144, No. 2, Feb. 1997, pp. 694–697.

Bensahel et al., "Industrial single wafer processing of in–situ doped polycrystalline Si and $Si_{1-x}Ge_x$," *Solid State Technology*, Mar. 1998, pp. S5–S10.

(Continued)

*Primary Examiner*—Michael Lebentritt
*Assistant Examiner*—Ron Pompey
(74) *Attorney, Agent, or Firm*—Knobbe Martens Olson & Bear LLP

(57) ABSTRACT

Methods are provided herein for forming electrode layers over high dielectric constant ("high k") materials. In the illustrated embodiments, a high k gate dielectric, such as zirconium oxide, is protected from reduction during a subsequent deposition of silicon-containing gate electrode. In particular, a seed deposition phase includes conditions designed for minimizing hydrogen reduction of the gate dielectric, including low hydrogen content, low temperatures and/or low partial pressures of the silicon source gas. Conditions are preferably changed for higher deposition rates and deposition continues in a bulk phase. Desirably, though, hydrogen diffusion is still minimized by controlling the above-noted parameters. In one embodiment, high k dielectric reduction is minimized through omission of a hydrogen carrier gas. In another embodiment, higher order silanes aid in reducing hydrogen content for a given deposition rate.

42 Claims, 9 Drawing Sheets

U.S. PATENT DOCUMENTS

| | | | |
|---|---|---|---|
| 4,363,828 | A | 12/1982 | Brodsky et al. |
| 4,379,020 | A | 4/1983 | Glaeser et al. |
| 4,444,812 | A | 4/1984 | Gutsche |
| 4,495,218 | A | 1/1985 | Azuma et al. |
| 4,585,671 | A | 4/1986 | Kitagawa et al. |
| 4,592,933 | A | 6/1986 | Meyerson et al. |
| 4,634,605 | A | 1/1987 | Wiesmann |
| 4,684,542 | A | 8/1987 | Jasinski et al. |
| 4,745,088 | A | 5/1988 | Inoue et al. |
| 4,871,416 | A | 10/1989 | Fukuda |
| 4,963,506 | A | 10/1990 | Liaw et al. |
| 5,037,666 | A | 8/1991 | Mori |
| 5,080,933 | A | 1/1992 | Grupen-Shemansky et al. |
| 5,082,696 | A | 1/1992 | Sharp |
| 5,112,773 | A | 5/1992 | Tuttle |
| 5,189,504 | A | 2/1993 | Nakayama et al. ......... 257/422 |
| 5,198,387 | A | 3/1993 | Tang |
| 5,227,329 | A | 7/1993 | Kobayashi et al. |
| 5,242,847 | A | 9/1993 | Ozturk et al. |
| 5,250,452 | A | 10/1993 | Ozturk et al. |
| 5,324,684 | A | 6/1994 | Kermani et al. |
| 5,389,398 | A | 2/1995 | Suzuki et al. ............... 427/130 |
| 5,389,570 | A | 2/1995 | Shiozawa |
| 5,453,858 | A | 9/1995 | Yamazaki |
| 5,587,344 | A | 12/1996 | Ishikawa .................... 437/238 |
| 5,607,511 | A | 3/1997 | Meyerson |
| 5,607,724 | A | 3/1997 | Beinglass et al. |
| 5,614,257 | A | 3/1997 | Beinglass et al. |
| 5,648,293 | A | 7/1997 | Hayama et al. |
| 5,656,531 | A | 8/1997 | Thakur et al. |
| 5,695,819 | A | 12/1997 | Beinglass et al. |
| 5,698,771 | A | 12/1997 | Shields et al. ............. 73/31.05 |
| 5,700,520 | A | 12/1997 | Beinglass et al. |
| 5,707,744 | A * | 1/1998 | King et al. ................. 428/426 |
| 5,786,027 | A | 7/1998 | Rolfson |
| 5,789,030 | A | 8/1998 | Rolfson |
| 5,837,580 | A | 11/1998 | Thakur et al. |
| 5,863,598 | A | 1/1999 | Venkatesan et al. |
| 5,874,129 | A | 2/1999 | Beinglass et al. |
| 5,876,797 | A | 3/1999 | Beinglass et al. |
| 5,879,970 | A * | 3/1999 | Shiota et al. ............... 438/151 |
| 5,885,869 | A | 3/1999 | Turner et al. |
| 5,893,949 | A | 4/1999 | King et al. |
| 5,930,106 | A | 7/1999 | DeBoer et al. |
| 5,959,326 | A | 9/1999 | Aiso et al. |
| 5,998,289 | A | 12/1999 | Sagnes |
| 6,027,705 | A | 2/2000 | Kitsuno et al. |
| 6,027,975 | A | 2/2000 | Hergenrother et al. |
| 6,083,810 | A | 7/2000 | Obeng et al. |
| 6,124,626 | A | 9/2000 | Sandhu et al. .............. 257/532 |
| 6,159,828 | A | 12/2000 | Ping et al. ................... 438/486 |
| 6,171,662 | B1 | 1/2001 | Nakao ......................... 427/595 |
| 6,180,478 | B1 * | 1/2001 | Lee et al. ................... 438/309 |
| 6,197,669 | B1 | 3/2001 | Twu et al. ................... 438/585 |
| 6,197,694 | B1 | 3/2001 | Beinglass |
| 6,228,181 | B1 | 5/2001 | Yamamoto et al. ......... 148/33.5 |
| 6,281,559 | B1 * | 8/2001 | Yu et al. ..................... 257/407 |
| 6,319,782 | B1 * | 11/2001 | Nakabayashi ............... 438/300 |
| 6,326,311 | B1 | 12/2001 | Ueda et al. .................. 438/694 |
| 6,365,479 | B1 * | 4/2002 | U'Ren ......................... 438/320 |
| 6,373,112 | B1 * | 4/2002 | Murthy et al. .............. 257/407 |
| 6,444,512 | B1 * | 9/2002 | Madhukar et al. .......... 438/203 |
| 6,455,892 | B1 | 9/2002 | Okuno et al. ............... 257/328 |
| 6,613,695 | B1 | 9/2003 | Pomarede et al. .......... 438/767 |
| 2002/0098627 | A1 | 7/2002 | Pomarede et al. .......... 438/149 |

FOREIGN PATENT DOCUMENTS

| | | |
|---|---|---|
| JP | 59078918 A | 5/1984 |
| JP | 59078919 A | 5/1984 |
| JP | 60043485 A | 3/1985 |
| JP | 61153277 A | 7/1986 |
| JP | 62076612 A | 4/1987 |
| JP | 63003414 A | 1/1988 |
| JP | 63003463 A | 1/1988 |
| JP | 01217956 A | 8/1989 |
| JP | 01268064 A | 10/1989 |
| JP | 02155225 A | 6/1990 |
| JP | 03091239 A | 4/1991 |
| JP | 03185817 A | 8/1991 |
| JP | 03187215 A | 8/1991 |
| JP | 03292741 A | 12/1991 |
| JP | 04323834 A | 11/1992 |
| JP | 05021378 A | 1/1993 |
| JP | 05062911 A | 3/1993 |
| JP | 07249618 A | 9/1995 |
| JP | 08242006 A * | 9/1996 |
| JP | 10163485 | 6/1998 |

U.S. PATENT DOCUMENTS

Bloem, J., "High chemical vapour deposition rates of epitaxial silicon layers," *Journal of Crystal Growth*, vol. 18, (1973), pp. 70–76.

Bodnar et al., "Single–wafer Si and SiGe processes for advanced ULSI technologies," *Thin Solid Films*, vol. 294, (1997), pp. 11–14.

Rossi, Ronald C., "Low pressure chemical vapor deposition," *Handbook of Thin–Film Deposition Processes and Techniques*, pp. 80–81.

Caymax, et al., "UHV–VLPCVD heteroepitaxial growth of thin SiGe–layers on Si–substrates: Influence of pressure on kinetics and on surface–morphology," *Solid State Phenomena*, vol. 32–33, (1993), pp. 361–372.

Claassen et al., "Deposition of silicon from silane in a low–pressure hot–wall system," *Journal of Crystal Growth*, vol. 57, No. 2, (1982), pp. 259–266.

Edwards et al., "Diffusion of Ge along grain boundaries during oxidation of polycrystalline silicon–germanium films," *Mat. Res. Soc. Symp. Proc.*, vol. 319, (1994), pp. 183–188.

Edwards et al., "Dopant implantation and activation in polycrystalline–SiGe," *Mat. Res. Soc. Meeting—Sym. II*, Spring 1994, 6 pages.

Eversteyn et al., "Influence of $AsH_3$, and $B_2H_6$ on the growth rate and resistivity of polycrystalline silicon films deposited from a $SiH_4$–$H_2$ mixture," *Growth Rate and Resistivity of Si Films*, vol. 120, No. 1, Jan. 1973, pp. 106–110.

Hernandez et al., "Evidence of interdiffusion effect in stacked polycrystalline SiGe/Si layers for CMOS gate application," *Mat. Res. Soc. Meeting*, ($19_{13}$ 8), 6 pages.

Kamins et al., "Kinetics of silicon–germanium deposition by atmospheric–pressure chemical vapor deposition," *Appl. Phys. Lett.*, vol. 59, No. 2, Jul. 8, 1991, pp. 178–180.

King et al., "A polycrystalline $Si_{1-x}Ge_x$–gate CMOS technology," *IEEE*, vol. 253, (1990), pp. 10.4.1–10.4.4.

Li et al., "Rapid thermal chemical vapor deposition of polycrystalline silicon–germanium films on $SiO_2$ and their properties," *Mat. Res. Soc. Symp. Proc.*, vol. 403, (1996), pp. 333–338.

Lin et al., "Effects of $SiH_4$, $GeH_4$, and $B_2H_6$ on the nucleation and deposition of polycrystalline $Si_{1-x}Ge_x$ films," *J. Electrochem. Soc.*, vol. 141, No. 9, Sep. 1994, pp. 2559–2563.

Morosanu, C.E., "Thin films by chemical vapour deposition," *Thin Films Science and Technology*, 7, pp. 48.

Öztürk et al., "Rapid thermal chemical vapor deposition of germanium on silicon and silicon dioxide and new applications of Ge in ULSI technologies," *Journal of Electronic Materials,* vol. 19, No. 10, (1990), pp. 1129–1134.

Skotnicki et al., "SiGe gate for highly performant 0.15/018βm CMOS technology," *ESSDERC,* (1997), pp. 216.

* cited by examiner

INTEGRATION OF HIGH K GATE DIELECTRIC

REFERENCE TO RELATED APPLICATION

This application claims the priority benefit under 35 U.S.C. §119(e) to provisional application No. 60/268,337, filed Feb. 12, 2001; provisional application No. 60/279,256, filed Mar. 27, 2001; and provisional application No. 60/332,696, filed Nov. 13, 2001.

FIELD OF THE INVENTION

The invention relates generally to forming semiconductor layers in integrated circuit fabrication, and more particularly to forming gate electrodes over high dielectric constant ("high k") gate dielectrics in a transistor gate stack.

BACKGROUND OF THE INVENTION

Integrated circuit design is constantly being scaled down in pursuit of faster circuit operation and lower power consumption. Scaled dimensions in a circuit design generally requires attendant changes in fabrication processing.

A basic building block of integrated circuits is the thin film transistor (TFT). As is known in the art, the transistor typically includes a gate electrode separated from a semiconductor layer or substrate by a thin gate dielectric material. Although a common acronym for state-of-the-art transistors is MOS, for metal-oxide-silicon, the material of choice for the gate electrode has long been silicon rather than metal. Among other advantages, silicon gate electrodes are able to withstand high temperature processes and enable self-aligned doping processes used for completing the transistor, thus saving expensive masking steps.

Accordingly, conventional gate electrodes are formed of polysilicon doped with conductivity-enhancing impurities, such as arsenic, phosphorus or boron. Silicon can be deposited by CVD with in situ doping by flowing a dopant source gas (e.g., arsine, phosphine, diborane, etc.) concurrently with a silicon source gas (e.g. silane).

Recently, interest has been drawn to the possibility of doping silicon electrodes with germanium, thereby reducing the electrical work function of the transistor gate electrode. Accordingly, a reduced voltage is needed to operate the circuit, consequently generating less heat. Moreover, a silicon germanium gate electrode remains compatible with surrounding materials and current integrated circuit fabrication processes. Proposals for forming silicon germanium layers include in situ doping of a silicon layer by forming germane ($GeH_4$) along with silane ($SiH_4$) in a chemical vapor deposition (CVD) process.

While in situ doped CVD processes have been found to be effective in producing silicon germanium, the addition of germane to the silane flow has been found to significantly increase incubation or nucleation times over dielectric materials, particularly oxides such as silicon dioxide and some of the high-k materials discussed below. Similarly slow nucleation over dielectric materials occurs when chemical vapor depositing polysilicon while in situ flowing other dopant source gases (e.g., diborane, arsine or phosphine). Even undoped silicon deposition tends to nucleate poorly over dielectric materials.

Slow nucleation entails longer overall deposition times, lower throughput and consequently greater fabrication costs. The semiconductor industry is very sensitive to fabrication costs. Accordingly, any increase in wafer throughput, at any stage of processing, translates to reduced production costs and higher margins.

Single wafer processing has greatly improved temperature and gas flow distribution across the wafer. In exchange for greater process control, however, processing time has become even more critical than with batch systems. Every second added to processing times must be multiplied by the number of wafers being processed serially, one at a time, through the same single-wafer processing chamber. Conversely, any improvements in wafer throughput can translate to significant fabrication cost savings. CVD processes within single wafer tools typically employ carrier gases along with precursor gases to increase total pressure and consequently increase deposition rates.

One way in which SiGe or other in situ doped silicon deposition has been hastened is by the first formation of a nucleation layer, typically silicon, over the gate dielectric, followed by poly-SiGe deposition. However, this additional step complicates the process flow and requires adjustment of the doping concentrations at the dielectric-electrode interface to ensure the desired work function for the transistor. Other recent work optimizing silicon and poly-SiGe deposition processes has also focused on increasing deposition rates while maintaining layer uniformity. For example, U.S. Pat. Nos. 5,607,724; 5,614,257; 5,700,520; 5,874,121; and 5,876,797 describe methods of depositing polysilicon at high rates by CVD under "high pressure" conditions.

Batch systems, unlike single wafer tools, process multiple wafers at one time. Accordingly, speed is not as critical and other options are opened. For example, low pressure chemical vapor deposition (LPCVD) can be employed to attain greater process control at lower deposition rates. In LPCVD processes, deposition can be attained without carrier gases.

Another area in which process control is particularly critical is the fabrication of transistor gate dielectrics. In the pursuit of ever faster and more efficient circuits, semiconductor designs are continually scaled down with each product generation. Transistor switching time plays a large role in the pursuit of faster circuit operation. Switching time, in turn, can be reduced by reducing the channel length of the transistors. In order to realize maximum improvements in transistor performance, vertical dimensions should be scaled along with horizontal dimensions. Accordingly, effective gate dielectric thickness, junction depth, etc. will all decrease with future generation integrated circuits.

Conventional gate dielectrics are formed of high quality silicon dioxide and are typically referred to as "gate oxide" layers. Ultra thin gate oxides (e.g., less than 5 nm), however, have been found to exhibit high defect densities, including pinholes, charge trapping states, and susceptibility to hot carrier injection effects. Such high defect densities lead to leakage currents through the gate dielectric and rapid device breakdown unacceptable for circuit designs with less than 0.25 µm gate spacing, i.e., sub-quarter-micron technology.

While care under laboratory conditions can be used to control defect densities, such control has been difficult to achieve under commercial volume fabrication conditions. Moreover, even if the integrity of the oxide is perfectly maintained, quantum-mechanical effects set fundamental limits on the scaling of gate oxide. At high electric field strengths, direct tunneling dominates over Fowler-Nordheim tunneling, and largely determines oxide scaling limits. These scaling limits have been estimated at about 2 nm for logic circuits, and about 3 nm for more leakage-sensitive memory arrays in dynamic random access memory (DRAM) circuits. See, e.g., Hu et al., "*Thin Gate Oxides Promise High Reliability,*" SEMICONDUCTOR INTERNATIONAL (July 1998), pp. 215–222.

Theoretically, incorporating materials of higher dielectric constant into the gate dielectric opens the door to further device scaling. Due to higher dielectric constant, many materials can exhibit the same capacitance as a thinner silicon dioxide layer, such that a lower equivalent oxide thickness can be achieved without tunnel-limited behavior. Silicon nitride ($Si_3N_4$), for example, has a higher dielectric constant than $SiO_2$ and also demonstrates good diffusion barrier properties, resisting boron penetration. More exotic materials with even higher dielectric constants, including aluminum oxide ($Al_2O_3$), zirconium oxide ($ZrO_2$), hafnium oxide ($HfO_2$), barium strontium titanate (BST), strontium bismuth tantalate (SBT), tantalum oxide ($Ta_2O_5$), etc., are also being investigated to allow further device scaling. Such dielectrics, with dielectric constant ("k") values greater than about 7, are referred to herein as "high k dielectrics" or "high k materials."

Similar high quality, thin dielectric layers are desirable in other contexts of integrated circuit fabrication. Integrated capacitors in memory arrays must exhibit a certain minimum capacitance for proper data storage and retrieval. Some efforts to increase capacitance for a given memory cell space have focused on the use of materials characterized by high dielectric constants (high k materials), such as those listed above.

As noted above, it is often difficult to deposit electrode materials, such as doped silicon or silicon germanium alloys, over conventional silicon oxides as well as many of the high k materials currently under investigation. Intermediate layers of various compositions are often employed prior to deposition for a variety of reasons, including otherwise poor adhesion, nucleation, electrical interface properties, diffusion, etc. Such intermediate layers add to the complexity and cost of fabrication, and can also occupy valuable space within high aspect ratio features, such as contact vias or folded structures for high surface area capacitors. In some contexts, like the formation of gate dielectrics and capacitor dielectrics, additional insulating layers (e.g., silicon nitride) increase the overall dielectric thickness and reduce the effectiveness of the layer, contrary to the trend for scaling down integrated circuits.

Accordingly, a need exists for improvements in the integration of dielectric layers and conductors in semiconductor fabrication, particularly at interfaces in transistor gate stacks.

SUMMARY OF THE INVENTION

The present invention provides methods for improving deposition over high k materials, with k values over 7, such as aluminum oxide ($Al_2O_3$), zirconium oxide ($ZrO_2$), hafnium oxide ($HfO_2$), tantalum oxide ($Ta_2O_5$), barium strontium titanate (BST), strontium bismuth tantalate (SBT), and various lanthanide (rare earth) oxides. The invention is illustrated in the context of transistor gate stacks, where silicon-based materials are deposited over high k gate dielectrics.

The inventors have found that traditional methods of depositing silicon-containing, materials, such as polysilicon and poly-SiGe, over high k dielectrics tend to results in poor electrical performance of resultant devices. One possible reason for this poor performance identified by the inventors is the reduction of oxides Accordingly, processes are provided herein for depositing electrode materials, preferably silicon-containing layers, over high k materials while minimizing reduction of high k materials. At least during an initial seed phase, deposition conditions are arranged to minimize diffusion of hydrogen to the high k material. Preferably, a second or bulk phase of deposition includes altered conditions arranged to increase the deposition rate such that overall throughput for the deposition is not excessively affected. However, conditions during even the bulk phase are preferably arranged to reduce hydrogen diffusion to high k material, relative to conventional deposition processes in single wafer tools.

In accordance with one aspect of the invention, a method is provided for forming a transistor gate stack. The method includes forming a high dielectric constant material over a semiconductor substrate. A silicon-containing seed layer is then deposited over the high dielectric constant material under seed phase conditions that are selected to minimize hydrogen reduction of the high dielectric constant material. A silicon-containing bulk layer is then deposited over the seed layer under bulk phase conditions, which are different from the seed phase conditions. The bulk phase conditions are selected to result in a higher deposition rate than the seed phase conditions.

In accordance with another aspect of the invention, a method is provided for forming a structure in an integrated circuit. The method includes forming a layer of high dielectric constant material. An electrode material is deposited over the layer of high dielectric constant material by flowing a higher order silane. An exemplary higher order silane is trisilane.

In accordance with another aspect of the invention, a method is provided for forming a silicon-containing material over a high dielectric constant material. The method includes loading a substrate into a single-substrate reaction chamber. The method also includes depositing a silicon-containing layer over a high dielectric constant layer on the substrate without flowing hydrogen.

BRIEF DESCRIPTION OF THE DRAWINGS

The invention will be better understood from the detailed description of the preferred embodiments and from the appended drawings, which are meant to illustrate and not to limit the invention, and wherein.

DETAILED DESCRIPTION OF THE PREFERRED EMBODIMENT

Figure 1:
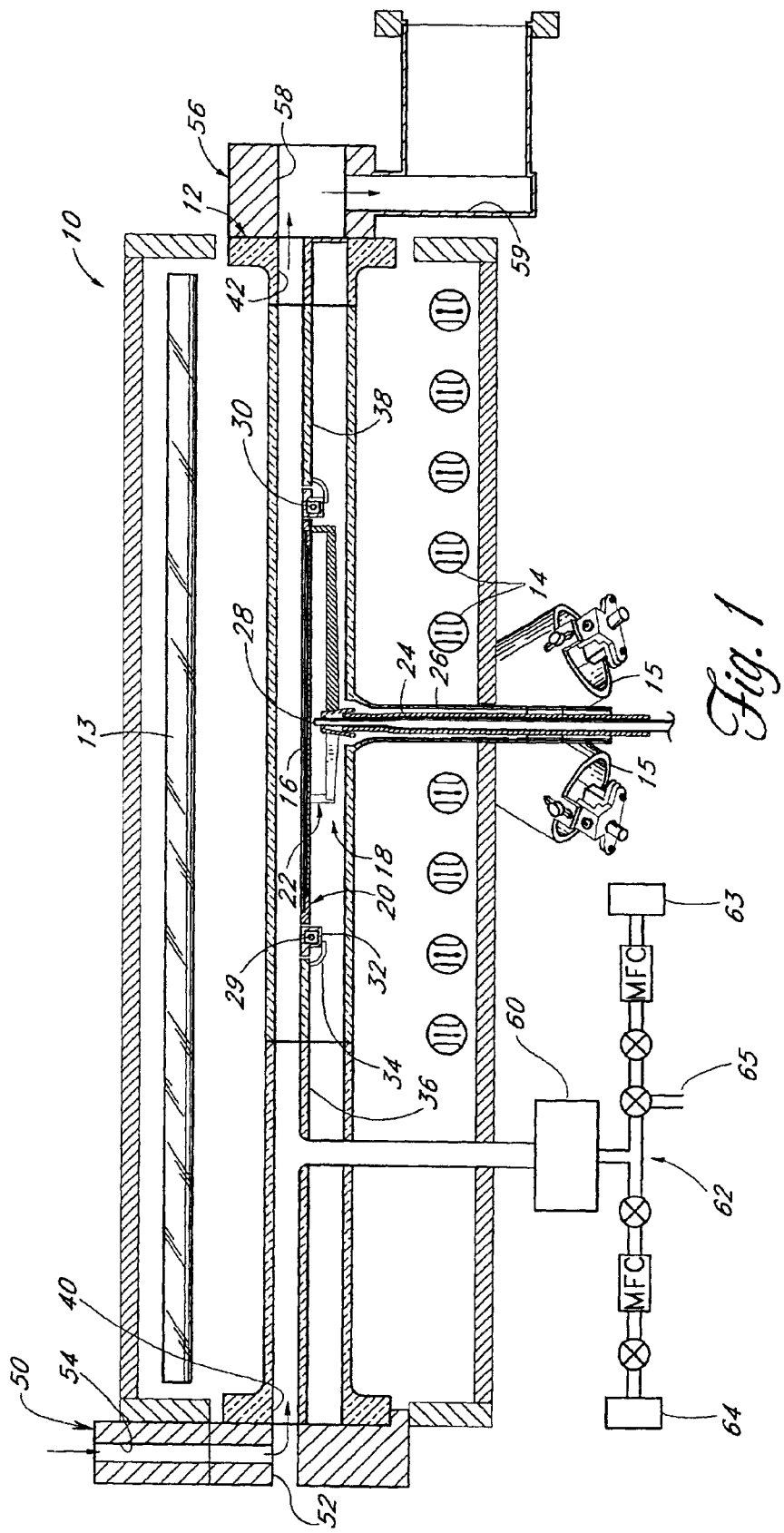
FIG. 1 is a schematic sectional view of an exemplary single-substrate reaction chamber for use with the preferred embodiments.

While the preferred embodiments are described in the context of transistor gate stacks, the skilled artisan will readily appreciate that the principles disclosed herein have application to a variety of contexts in which layers must be deposited over high k materials. An example of such a context is in the formation of capacitor electrodes over high k dielectrics, proposed for high density memory cells in random access memory (RAM) arrays. The methods described herein are particularly advantageous for depositing silicon-containing layers over high k materials, but the skilled artisan will also appreciate applications of the principles and advantages described herein to depositing metallic electrodes over high k materials.

As noted in the Summary section above, conventional gate electrode deposition over high k gate dielectrics has been found to result in poor electrical performance of the resultant devices. In order to increase the reliability and yield of the integrated circuits including high k dielectrics, the preferred embodiments provide methods for depositing electrode materials in a manner that minimized reduction of the high k material. One embodiment of the present invention provides a two-step deposition process for providing a conductor over the high k dielectric. The first step is optimized to minimize reduction of high k material. Such reduction can leave metal or metal silicates in place of metal oxides, reducing the effective dielectric constant and possibly shorting the gate dielectric. The second step includes altered conditions to increase deposition rate relative to the first step. Preferably, the second step is conducted under conditions that reduce risk of chemically reducing the underlying high k material, relative to conventional deposition processes for single wafer tools.

Prior to describing the processes in greater detail, the preferred reactor for depositing silicon-containing conductive layers by CVD is first described below. While not illustrated separately, the ALD processes described below are more preferably performed in a Pulsar™ 2000 ALCVD™ Reactor, commercially available from ASM Microchemistry Oy of Espoo, Finland.

Preferred Reactor

The preferred embodiments are presented in the context of a single-substrate, horizontal flow cold-wall reactor. "Single wafer" processing tools, in general, demonstrate greater process control and uniformity than traditional batch systems, but do so at the expense of throughput, since only one or at best a handful of substrates can be processed at one time. The illustrated single-pass horizontal flow design also enables laminar flow of reactant gases, with low residence times, which in turn facilitates sequential processing while minimizing reactant interaction with each other and with chamber surfaces. Thus, among other advantages, such a laminar flow enables sequentially flowing reactants that might adversely react with each other. Reactions to be avoided include highly exothermic or explosive reactions, such as produced by oxygen and hydrogen-bearing reactants, and reactions that produce particulate contamination of the chamber.

FIG. 1 shows a chemical vapor deposition (CVD) reactor 10, including a quartz process or reaction chamber 12, constructed in accordance with a preferred embodiment, and for which the methods disclosed herein have particular utility. While originally designed to optimize epitaxial deposition of silicon on a single substrate at a time, the inventors have found the superior processing control of the illustrated reactor 10 to have utility in CVD of a number of different materials. Moreover, the illustrated reactor 10 can safely and cleanly accomplish multiple treatment steps sequentially in the same chamber 12. The basic configuration of the reactor 10 is available commercially under the trade name Epsilon® from ASM America, Inc. of Phoenix, Ariz.

A plurality of radiant heat sources are supported outside the chamber 12 to provide heat energy in the chamber 12 without appreciable absorption by the quartz chamber 12 walls. While the preferred embodiments are described in the context of a "cold wall" CVD reactor for processing semiconductor wafers, it will be understood that the processing methods described herein will have utility in conjunction with other heating/cooling systems, such as those employing inductive or resistive heating.

The illustrated radiant heat sources comprise an upper heating assembly of elongated tube-type radiant heating elements 13. The upper heating elements 13 are preferably disposed in spaced-apart parallel relationship and also substantially parallel with the reactant gas flow path through the underlying reaction chamber 12. A lower heating assembly comprises similar elongated tube-type radiant heating elements 14 below the reaction chamber 12, preferably oriented transverse to the upper heating elements 13. Desirably, a portion of the radiant heat is diffusely reflected into the chamber 12 by rough specular reflector plates (not shown) above and below the upper and lower lamps 13, 14, respectively. Additionally, a plurality of spot lamps 15 supply concentrated heat to the underside of the substrate support structure (described below), to counteract a heat sink effect created by cold support structures extending through the bottom of the reaction chamber 12.

Each of the elongated tube type heating elements 13, 14 is preferably a high intensity tungsten filament lamp having a transparent quartz envelope containing a halogen gas, such as iodine. Such lamps produce full-spectrum radiant heat energy transmitted through the walls of the reaction chamber 12 without appreciable absorption. As is known in the art of semiconductor processing equipment, the power of the various lamps 13, 14, 15 can be controlled independently or in grouped zones in response to temperature sensors.

A workpiece or substrate, preferably comprising a silicon wafer 16, is shown supported within the reaction chamber 12 upon a substrate support structure 18. Note that, while the substrate of the illustrated embodiment is a single-crystal silicon wafer, it will be understood that the term "substrate" broadly refers to any surface on which a layer is to be deposited. Moreover, the principles and advantages described herein apply equally well to depositing layers over numerous other types of substrates, including, without limitation, glass substrates such as those employed in flat panel displays.

The illustrated support structure 18 includes a substrate holder 20, upon which the wafer 16 rests, and a support spider 22. The spider 22 is mounted to a shaft 24, which extends downwardly through a tube 26 depending from the chamber lower wall. Preferably, the tube 26 communicates with a source of purge or sweep gas which can flow during processing, inhibiting process gases from escaping to the lower section of the chamber 12.

A plurality of temperature sensors are positioned in proximity to the wafer 16. The temperature sensors may take any of a variety of forms, such as optical pyrometers or thermocouples. The number and positions of the temperature sensors are selected to promote temperature uniformity. Preferably, the temperature sensors directly or indirectly sense the temperature of positions in proximity to the wafer.

In the illustrated embodiment, the temperature sensors comprise thermocouples, including a first or central thermocouple 28, suspended below the wafer holder 20 in any suitable fashion. The illustrated central thermocouple 28 passes through the spider 22 in proximity to the wafer holder 20. The reactor 10 further includes a plurality of secondary or peripheral thermocouples, also in proximity to the wafer 16, including a leading edge or front thermocouple 29, a trailing edge or rear thermocouple 30, and a side thermocouple (not shown). Each of the peripheral thermocouples is housed within a slip ring 32, which surrounds the substrate holder 20 and the wafer 16. Each of the central and peripheral thermocouples are connected to a temperature controller, which sets the power of the various heating elements 13, 14, 15 in response to the readings of the thermocouples.

In addition to housing the peripheral thermocouples, the slip ring 32 absorbs and emits radiant heat during high temperature processing, such that it compensates for a tendency toward greater heat loss or absorption at wafer edges, a phenomenon which is known to occur due to a greater ratio of surface area to volume in regions near such edges. By minimizing edge losses, the slip ring 32 can reduce the risk of radial temperature non-uniformities across the wafer 16. The slip ring 32 can be suspended by any suitable means. For example, the illustrated slip ring 32 rests upon elbows 34 that depend from a front chamber divider 36 and a rear chamber divider 38. The dividers 36, 38 desirably are formed of quartz. In some arrangements, the rear divider 38 can be omitted.

The illustrated reaction chamber 12 includes an inlet port 40 for the injection of reactant and carrier gases, and the wafer 16 can also be received therethrough. An outlet port 42 is on the opposite side of the chamber 12, with the wafer support structure 18 positioned between the inlet 40 and the outlet 42.

An inlet component 50 is fitted to the reaction chamber 12, adapted to surround the inlet port 40, and includes a horizontally elongated slot 52 through which the wafer 16 can be inserted. A generally vertical inlet 54 receives gases from remote sources, as will be described more fully below, and communicates such gases with the slot 52 and the inlet port 40. The inlet 54 can include gas injectors as described in U.S. Pat. No. 5,221,556, issued Hawkins et al., or as described with respect to FIGS. 21–26 in U.S. patent application Ser. No. 08/637,616, filed Apr. 25, 1996, the disclosures of which are hereby incorporated by reference. Such injectors are designed to maximize uniformity of gas flow for the single-wafer reactor.

An outlet component 56 similarly mounts to the process chamber 12 such that an exhaust opening 58 aligns with the outlet port 42 and leads to exhaust conduits 59. The conduits 59, in turn, can communicate with suitable vacuum means (not shown) for drawing process gases through the chamber 12. In the preferred embodiment, process gases are drawn through the reaction chamber 12 and a downstream scrubber (not shown). A pump or fan is preferably included to aid in drawing process gases through the chamber 12, and to evacuate the chamber for low pressure processing.

The reactor 10 also optionally includes a source 60 of excited species, preferably positioned upstream from the chamber 10. The excited species source 60 of the illustrated embodiment comprises a remote plasma generator, including a magnetron power generator and an applicator along a gas line 62. An exemplary remote plasma generator is available commercially under the trade name TRW-850 from Rapid Reactive Radicals Technology (R3T) GmbH of Munich, Germany. In the illustrated embodiment, microwave energy from a magnetron is coupled to a flowing gas in an applicator along a gas line 62. A source of precursor gases 63 is coupled to the gas line 62 for introduction into the excited species generator 60. A source of carrier gas 64 is also coupled to the gas line 62. One or more further branch lines 65 can also be provided for additional reactants. As is known in the art, the gas sources 63, 64 can comprise gas tanks, bubblers, etc., depending upon the form and volatility of the reactant species. Each gas line can be provided with a separate mass flow controller (MFC) and valves, as shown, to allow selection of relative amounts of carrier and reactant species introduced to the excited species generator 60 and thence into the reaction chamber 12. It will be understood that, in other arrangements, the excited species can be generated within the process chamber. The preferred processes described below, however, do not employ excited species but are rather species of thermal CVD.

Wafers are preferably passed from a handling chamber (not shown), which is isolated from the surrounding environment, through the slot 52 by a pick-up device. The handling chamber and the processing chamber 12 are preferably separated by a gate valve (not shown) of the type disclosed in U.S. Pat, No. 4,828,224, the disclosure of which is hereby incorporated herein by reference.

The total volume capacity of a single-wafer process chamber 12 designed for processing 200 mm wafers, for example, is preferably less than about 30 liters, more preferably less than about 20 liters, and most preferably less than about 10. The illustrated chamber 12 has a capacity of about 7.5 liters. Because the illustrated chamber 12 is divided by the dividers 36, 38, wafer holder 20, ring 32, and the purge gas flowing from the tube 26, however, the effective volume through which process gases flow is around half the total volume (about 3.77 liters in the illustrated embodiment). Of course, it will be understood that the volume of the single-wafer process chamber 12 can be different, depending upon the size of the wafers for which the chamber 12 is designed to accommodate. For example, a single-wafer processing chamber 12 of the illustrated type, but for 300 mm wafers, preferably has a capacity of less than about 100 liters, more preferably less than about 60 liters, and most preferably less than about 30 liters. One 300 mm wafer processing chamber has a total volume of about 24 liters, with an effective processing gas capacity of about 11.83 liters.

As mentioned, a plurality of vapor-phase precursor sources (not shown) are connected to the inlet 54 via gas lines with attendant safety and control valves, as well as mass flow controllers ("MFCs"), which are coordinated at a gas panel. Process gases are communicated to the inlet 54 in accordance with directions programmed into a central controller and distributed into the process chamber 12 through injectors. After passing through the process chamber 12, unreacted process gases and gaseous reaction by-products are exhausted to a scrubber to condense environmentally dangerous fumes before exhausting to the atmosphere.

The gas sources preferably include a source of carrier gas. Preferably, the carrier gas comprises an inert gas such as nitrogen ($N_2$). Nitrogen gas is relatively inert and compatible with many integrated materials and process flows. Other possible inert carrier gases include noble gases, such as helium (He) or argon (Ar). A source of hydrogen gas ($H_2$) can also be provided to the reactor 10, but is not employed in the seed phase of the deposition, and is preferably not employed in the bulk phase either, as will be understood from the discussion below. $H_2$ may be desirable for other processes conducted in the reactor 10.

The vapor-phase sources can include liquid reactant sources. The liquid source can comprise, for example, liquid dichlorosilane (DCS), trichlorosilane (TCS), or metallorganic sources in a bubbler, and a gas line for bubbling and carrying vapor phase reactants from the bubbler to the reaction chamber 12. The bubbler can alternatively (or additionally) hold liquid Ta(OC$_2$H$_5$), as a metal source, while a gas line serves to bubble carrier gas through the liquid metal source and transport metalorganic precursors to the reaction chamber 12 in gaseous form.

Desirably, the reactor 10 will also include other source gases such as dopant sources (e.g., phosphine, arsine and diborane) and etchants for cleaning the reactor walls and other internal components (e.g., HCl or NF$_3$/Cl$_2$ provided as the plasma source gas 63 for feeding the excited species generator 60). For deposition of poly-SiGe in accordance with some embodiments, a source of germanium (e.g., germane or GeH$_4$) can also be provided for doping or formation of SiGe films.

A silicon source is also provided. As is known in the art, silanes, including monosilane (SiH$_4$), DCS and TCS, are common volatile silicon sources for CVD applications, such as the deposition of poly-SiGe, silicon nitride, metal silicides, and extrinsic or intrinsic silicon (polycrystalline, amorphous or epitaxial, depending upon deposition parameters). Less common sources are disilane (Si$_2$H$_6$), trisilane (Si$_3$H$_8$) and tetrasilane (Si$_4$H$_{10}$), which are described in the preferred methods below. Non-halogenated silanes such as monosilane, disilane, trisilane and tetrasilane are preferred to avoid chlorine incorporation into sensitive gate dielectric structures. Higher orders of silane are particularly useful for the preferred methods, in which hydrogen content of the source gases is minimized.

Process Flow

Figure 2:
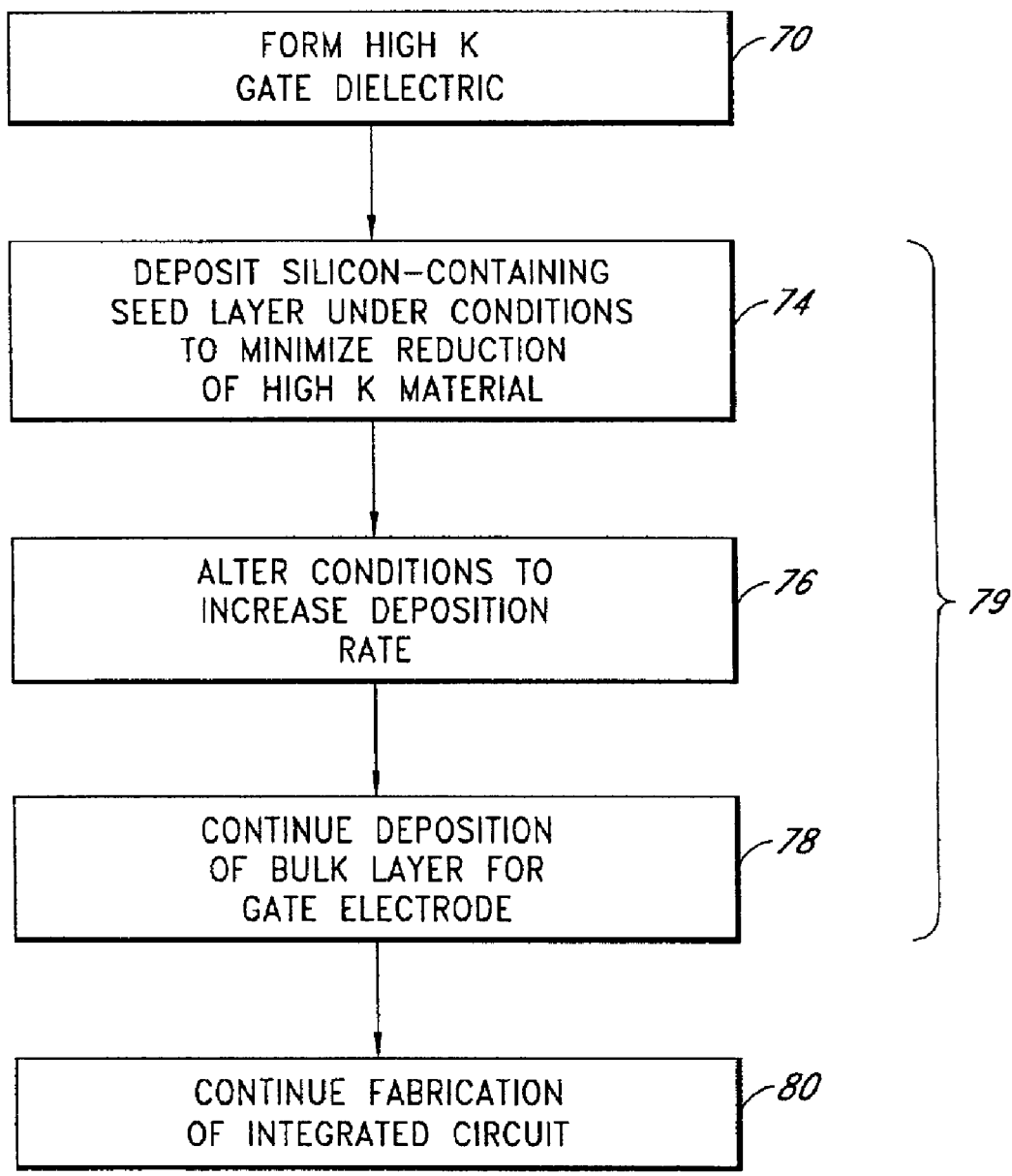
FIG. 2 is a flow chart illustrating a sequence for forming integrated transistor gate stacks in accordance with preferred embodiments of the invention.
Figure 3:
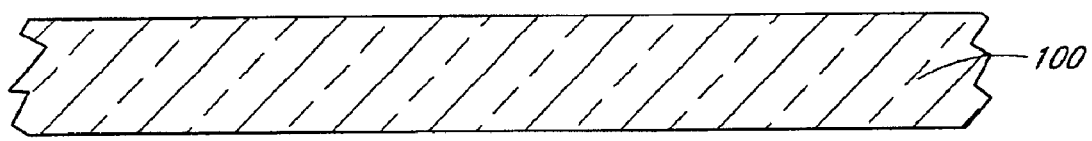
FIG. 3 is a schematic cross-section of a portion of a semiconductor substrate, representing the upper surface of a workpiece, in accordance with a preferred embodiment.

FIG. 2 shows a general process sequence in accordance with the invention, illustrated in the context of forming a transistor gate stack on a semiconductor substrate. Prior to the illustrated process, a single substrate, including a semiconductor structure, is first cleaned to remove contaminants and naturally occurring or native oxide on the semiconductor structure. The semiconductor structure can comprise, among other things, an epitaxial silicon layer or the top surface of a monolithic silicon layer. Conventionally, wafer cleaning prior to gate oxide growth is conducted ex situ prior to loading the wafer into the process chamber. For example, wafers may be cleaned in an SC1/HF wet etch bath. Alternatively, an integrated HF and acetic acid vapor clean can be conducted in a neighboring module within a cluster tool, reducing transport time and opportunity for recontamination or reoxidation. For some applications, the cleaning oxide left by the SC1 step is not removed, but is instead used as the initial oxide layer. In another possibility, a hydrogen bake step can be conducted within the chamber 12 (FIG. 1) to sublimate native oxide. Small amounts of HCl vapor can be added to this step to aid in cleaning metal contaminants and the like during the hydrogen bake. In still another arrangement, plasma products can assist or conduct in situ cleaning, such as by substituting H radicals for hydrogen gas.

Either after ex situ cleaning, or prior to in situ cleaning, the wafer or other substrate is loaded into the process chamber. Cleaning of native oxide tends to leave a hydrogen-terminated surface, which advantageously inhibits spontaneous reoxidation upon exposure to the clean room environment or other source of oxidants. Such hydrogen termination may need to be desorbed prior to further processes.

A high dielectric constant ("high k") material is then formed 70 on the substrate. As noted in the Background section, such high k materials are generally forms of metallic oxide with k values greater than about 7, including aluminum oxide (Al$_2$O$_3$), zirconium oxide (ZrO$_2$), hafnium oxide (HfO$_2$), tantalum oxide (Ta$_2$O$_5$), barium strontium titanate (BST), strontium bismuth tantalate (SBT), and lanthanide oxides. The last listed dielectrics include oxides of such physically stable "rare earth" elements as scandium (Sc), yttrium (Y), lanthanum (La), cerium Ce, praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu).

The high k material can be deposited by any suitable process, including PVD, CVD, MOCVD, etc. In accordance with the preferred embodiment, the deposition 70 comprises an atomic layer deposition (ALD) process. ALD is a chemically self-limiting process, whereby alternated pulses of reaction precursors saturate a substrate and leave no more than one monolayer of material per pulse. Temperatures are maintained above condensation levels and below thermal decomposition levels for the reactants. The precursors are selected to ensure self-saturating reactions, because an adsorbed layer in one pulse leaves a surface termination that is non-reactive with the gas phase reactants of the same pulse. A subsequent pulse of different reactants does react with the previous termination to enable continued deposition. Thus, each cycle of alternated pulses leaves no more than about one molecular layer of the desired material. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601–663, Elsevier Science B.V. 1994, the disclosures of which are incorporated herein by reference.

Depending upon the condition of the substrate and the chemistries employed, ALD does not deposit equally well on different starting substrates. Some ALD process recipes, for example, have been found slow or even non-operative in depositing over silicon, and particularly etched or cleaned silicon surfaces (typically hydrogen-terminated). Accordingly, it may be advantageous to employ a surface treatment to render the substrate susceptible to adsorption by the ALD precursors. For example, a first water pulse may react with the silicon surface and leave a hydroxyl terminated (—OH) or oxygen bridged (Si—O—Si) silicon surface that serves as a starting surface for the chemisorption of typical ALD metal precursors, such as trimethyl aluminum ((CH$_3$)$_3$Al) of the example below. An extremely thin interfacial silicon oxide layer (see FIGS. 8–11) may also result from such surface termination.

In one embodiment, the silicon wafer was loaded into the reaction space of Pulsar™ 2000 reactor (commercially available from ASM Microchemistry of Espoo, Finland), which is designed for ALD processes. Such a tool can advantageously be clustered with the tool illustrated in FIG. 1. The reaction space was evacuated to vacuum with a mechanical vacuum pump. After evacuation the pressure of the reaction space was adjusted to about 5–10 mbar (absolute) with flowing nitrogen gas that had a purity of 99.9999%. Then the reaction space was stabilized at 300° C. Alternating vapor phase pulses of (CH$_3$)$_3$Al and H$_2$O, vaporized from external sources, were introduced into the reaction space and contacted with the substrate surface. The source chemical pulses were separated from each other with flowing nitrogen gas. In other arrangements, inert gases such as helium, neon or argon can be substituted for nitrogen.

Each pulsing cycle consists of four basic steps:

(CH$_3$)$_3$Al pulse

N$_2$ purge

H$_2$O pulse

N$_2$ purge

An exemplary aluminum oxide deposition cycle is summarized in Table I.

TABLE I $Al_2O_3$

| Phase | Reactant | Temperature (° C.) | Pressure (mbar) | Time (sec) |
|---|---|---|---|---|
| pulse 1 | TMA | 300 | 5–10 | 0.2 |
| purge 1 | — | 300 | 5–10 | 1.1 |
| pulse 2 | $H_2O$ | 300 | 5–10 | 1.5 |
| purge 2 | — | 300 | 5–10 | 3.0 |

The number of cycles determine the thickness of the layer. The growth rate of $Al_2O_3$ from $(CH_3)_3Al$ (TMA) and $H_2O$ is typically near 0.1 nm/cycle or 1 Å/cycle at 300° C., or about 3–4 cycles/monolayer ($Al_2O_3$ has a bulk lattice parameter of about 3 Å). The methyl terminations left by each TMA pulse reduce the number of available chemisorption sites, such that less than a full monolayer forms with each pulse. The pulsing cycle is repeated sufficient times to produce the desired layer thickness. Aluminum oxide can be used as the gate dielectric, or as a thin layer prior to forming another dielectric layer.

In another arrangement, $ZrO_2$ was deposited by an ALD type process. $ZrCl_4$ vapor is introduced to the reaction chamber and exposed the wafer surface for 1.5 s. This is referred to as pulse A. The reaction chamber was purged with nitrogen gas for 3.0 s to remove surplus $ZrCl_4$ and byproducts from the reaction chamber. This is referred to as purge A. Then water vapor was introduced to the reaction chamber and exposed to the wafer surface for 3.0 s. This is referred to as pulse B. Residual $H_2O$ and reaction byproducts were removed by purging the reaction chamber for 4.0 s. This is referred to as purge B. During each of the reaction phases, the reactants are supplied in sufficient quantity for the given other parameters to saturate the surface.

Each pulsing cycle consists of four basic steps:

$ZrCl_4$ pulse
$N_2$ purge
$H_2O$ pulse
$N_2$ purge

This exemplary high-k deposition cycle is summarized in Table II.

TABLE II $ZrO_2$

| Phase | Reactant | Temperature (° C.) | Pressure (mbar) | Time (sec) |
|---|---|---|---|---|
| pulse A | $ZrCl_4$ | 300 | 5–10 | 1.5 |
| purge A | — | 300 | 5–10 | 3.0 |
| pulse B | $H_2O$ | 300 | 5–10 | 3.0 |
| purge B | — | 300 | 5–10 | 4.0 |

In one embodiment, the cycle of Table II, consisting of pulse A, purge A, pulse B, purge B, was repeated 51 times. The average deposition rate is about 0.59 Å/cycle at 300° C., such that the $ZrO_2$ thickness was about 30 Å.

More generally, temperatures during the process preferably fall between about 200° C. and 500° C., depending upon the acceptable levels of chlorine in the film. For an amorphous $ZrO_2$ layer, the temperature is more preferably at the low end of this range, between about 200° C. and 250° C., and most preferably at about 225° C. For a crystalline film, the temperature is more preferably at the high end of this range, between about 250° C. and 500° C., and most preferably about 300° C. As will be appreciated by the skilled artisan, however, mixtures of amorphous and crystalline composition result at the boundary of these two regimes. The illustrated process produces a largely crystalline $ZrO_2$ film.

In this case, the metal monolayer formed in the metal phase is self-terminated with chloride, which does not readily react with excess $ZrCl_4$ under the preferred conditions. The preferred oxygen source gas, however, reacts with or adsorbs upon the chloride-terminated surface during the oxygen phase in a ligand-exchange reaction limited by the supply of zirconium chloride complexes previously adsorbed. Moreover, oxidation leaves a hydroxyl and oxygen bridge termination that does not further react with excess oxidant in the saturative phase.

Preferably, sufficient cycles are conducted to grow between about 20 Å and 60 Å of $ZrO_2$. More preferably, sufficient cycles are conducted to grow between about 20 Å and 40 Å. The dielectric constant of the layer is between about 18 and 24. In the illustrated examples, 30 Å of $Zr_2O_3$ was formed.

In some arrangements, the gate dielectric can be next cleaned (not shown) and optionally treated to facilitate further deposition. Cleaning, if performed, is preferably done within the cluster tool environment, and in some cases can be performed in the same chamber as the preceding or subsequent deposition. However, cleaning at this stage is preferably omitted to prevent damage to the high k material prior to further processing.

Next, the gate electrode is deposited over the gate dielectric, preferably in the chamber illustrated in FIG. 1. The gate electrode preferably contains silicon and is CVD deposited. For example, the gate electrode can comprise a CVD polysilicon, doped or undoped, or a silicon germanium alloy, preferably having the form $Si_{1-x}Ge_x$, deposited by flowing a silicon source (preferably silane, disilane or trisilane) and a germanium source (e.g., germane or digermane) over the gate dielectric.

Gate electrode formation comprises two stages: a seed phase 74 and a bulk phase 78. Because these two phases are selected to optimize different features, the illustrated process preferably (but not necessarily) includes alteration 76 of deposition conditions between the two deposition phases 74, 78. Altering 76 conditions can include changing the process gas compositions, partial pressures, and/or temperatures. Together, the seed phase 74 and bulk phase 78 form a gate electrode deposition 79.

Conditions are arranged in the seed phase 74 to minimize chemical reduction of the underlying high k. The illustrated high k material includes a top layer of $ZrO_2$, which has been found particularly susceptible to reduction during conventional polysilicon or poly-SiGe deposition. Minimizing reduction preferably includes one or more of: minimizing hydrogen content in the process gases; minimizing process temperature to avoid hydrogen diffusion to the high k material during deposition; and minimizing silicon source gas partial pressure, thereby decreasing both hydrogen content and diffusion. Reducing hydrogen content and diffusion by these mechanisms, however, will generally involve a trade-off with process control and/or deposition rates. Accordingly, conditions for the seed phase deposition 74 are optimized to balance these considerations, depending in part upon the precursors employed.

For any silicon precursor, the seed phase 74 does not employ $H_2$ as a carrier gas. Accordingly, the deposition preferably proceeds with a non-hydrogen carrier gas, such as nitrogen, helium or argon. Alternatively, the carrier gas can be omitted entirely. Hydrogen content of the silicon process can be further minimized by alternatively or additionally using higher-order silanes as the silicon source gas, such as disilane and trisilane, which have a higher Si:H content. Temperature and pressure conditions preferred for the seed phase 74 using each of these precursors is discussed below.

Temperature conditions throughout the deposition 79 are preferably maintained between about 300° C. and 800° C., depending upon the precursors employed. Temperatures are preferably kept near the lower boundary for the seed phase 74, to minimize hydrogen diffusion to the high k material. For silane, temperatures are preferably between about 450° C. and 650° C., with an exemplary temperature of about 580° C.; for disilane, preferably between about 400° C. and 650° C., more preferably between about 450° C. and 600° C.; and for trisilane preferably between about 300° C. and 650° C., more preferably between about 400° C. and 600° C., and most preferably between about 450° C. and 575° C. Selection of the temperature, together with pressure (discussed below) will affect whether the formed layer is amorphous or polycrystalline. Amorphous layers have the advantage that larger crystals can be formed during a subsequent anneal. Polycrystalline material, on the other hand, facilitates dopant diffusion from the overlying bulk layer (deposited subsequently) along grain boundaries. Advantageously, amorphous silicon can be deposited at low temperatures and subsequently crystallized in the absence of hydrogen-containing process gases.

Silicon source gas partial pressure during the seed phase 74 is preferably between about 10 mTorr and 1 Torr for silane, with an exemplary partial pressure being about 150 mTorr. Low partial pressure helps to maintain a lower hydrogen content during the process. Due to the inherently lower H:Si ratio in higher order silanes, partial pressure for disilane and trisilane can be higher, preferably between about 10 mTorr and 1 Torr.

The seed phase can deposit silicon in situ doped or undoped, and can also include a germanium source. Preferably, however, the seed phase is undoped and followed by an in situ (or otherwise) doped bulk phase, and dopants can subsequently diffuse through the seed layer.

Total pressure during the seed phase 74 is preferably between about 100 mTorr and 100 Torr, more preferably between about 1 Torr and 10 Torr, with a typical pressure of around 3 Torr. Nitrogen or other inert carrier gas supplies the additional pressure, and aids to keep deposition rates higher than without carrier. As a result of the above-noted conditions, deposition rates during the seed phase 74 are generally between about 10 Å/min and 500 Å/min, more typically about 10 Å/min and 100 Å/min. While higher deposition rates are desirable, these relatively low rates, for a single wafer tool, are acceptable in view of the advantages gained in maintaining the quality of the underlying high k material.

The seed phase 74 is conducted for on the order of about 1 minute, resulting in a preferred seed layer thickness between about 10 Å and 500 Å, more preferably between about to 10 Å and 100 Å. This thickness then serves as partial protection against hydrogen diffusion from the subsequent bulk phase 78 deposition.

Conditions in the bulk phase 78 can be identical to those of the seed phase, but are preferably altered 76 to increase the deposition rate, relative to that of the previous step. Although hydrogen might be employed as a carrier gas during this phase 78, facilitating greater control over temperature and process uniformity, it is preferred to continue the process without hydrogen, since hydrogen can readily diffuse through the existing seed layer to the underlying high k material. However, temperatures and partial pressures are preferably increased to attain a higher deposition rate.

If the preceding seed phase 74 is conducted without a carrier gas, altering 76 deposition conditions preferably includes adding a carrier gas. As noted, the carrier gas is preferably a non-hydrogen carrier gas, such as nitrogen, helium or argon. Hydrogen content is preferably continued to be minimized by omission of hydrogen carrier gas, and can be further or alternatively be minimized by continued use of higher-order silanes as the silicon source gas, such as disilane and trisilane, which have a lower H:Si content. Temperature and pressure conditions preferred for the seed phase 78 using each of these precursors is discussed below.

As noted above, temperature conditions throughout the deposition 79 are preferably maintained between about 300° C. and 800° C., depending upon the precursors employed. Temperatures are preferably increased for the bulk phase 78, to increase deposition rate and thus maintain a commercially acceptable throughput for the gate electrode deposition 79, while still maintaining a relatively low temperature to minimize diffusion of hydrogen. For silane, temperatures are preferably increased to greater than about 550° C.; for disilane, to greater than about 475° C.; and for trisilane to greater than about 500° C.

Silicon source gas partial pressure during the bulk phase 78 is preferably between about 1 Torr and 50 Torr for silane. Due to the lower reaction temperatures for higher order silanes, partial pressure for disilane and trisilane can be lower than for silane without affecting deposition rates, such that the partial pressure for disilane is preferably between about 1 Torr and 20 Torr, while that for trisilane is preferably between about 0.5 Torr and 20 Torr. Advantageously, in any of the illustrated embodiments, total pressure is preferably between 1 Torr and 100 Torr, more preferably between about 10 Torr and 80 Torr. At much lower pressures than 1 Torr (as is typical for batch LPCVD processes), high conformality can be achieved but it is difficult to nucleate continuous layers. On the other hand, at much high pressures than the preferred ranges it has been found that nucleation also appears to be very slow (e.g., at atmospheric pressures). The preferred ranges achieve a fine balance of temperature control insensitivity to patterned wafers and attendant emissivity effects, while obtaining very fast nucleation over oxides, particularly using trisilane. Surprisingly, conformality remains excellent at the preferred pressure ranges using trisilane for CVD, despite much higher pressures than those employed in LPCVD processes.

Total pressure during the bulk phase 78 is commensurately higher. Preferably nitrogen or other inert carrier gas supplies the additional pressure, and aids to keep depositions rate higher than without carrier. As a result of the above-noted conditions, deposition rates during the bulk phase 78 are preferably between about 500 Å/min and 2,000 Å/min, more preferably higher than 1,000 Å/min.

The bulk phase 78 is conducted for sufficient time to produce the desired overall thickness of the gate electrode. Typical overall thickness for the gate electrode (including both seed layer and bulk layer) for state of the art integrated circuit design is between about 1,500 Å and 2,000 Å.

It will be understood that the same principles can be applied to formation of poly-SiGe gate electrodes. Conditions can be controlled for minimizing hydrogen content and diffusion by appropriate selection of carrier gas, precursor gases, temperature and pressure. The seed phase preferably forms a silicon layer, and the bulk phase forms a poly-SiGe layer, from which germanium can diffuse through the seed layer to achieve the desired work function.

Once the gate stack has been completed, integrated circuit fabrication continues 80. Gate electrodes are preferably patterned by conventional photolithographic techniques and etching. The gate electrodes can be patterned prior to or after deposition of an optional further metal layer over the silicon-containing gate electrode layer for improved lateral signal strength, as is known in the art.

Having completed the gate stack, further processing to complete the integrated circuit follows. For example, gate stacks typically are insulated by blanket deposition of a dielectric and spacer etch. Transistor active areas are then doped to form source and drain regions to either side of the patterned electrodes, and wiring or "back end" processes complete the circuit.

Referring to FIGS. 3–7, the result of the above-described process is shown. A semiconductor substrate 100 is provided on or in a workpiece. The semiconductor substrate 100 typically comprises an epitaxial silicon layer or the upper surface of a single-crystal, intrinsically doped silicon wafer, although the skilled artisan will appreciate that other semiconductor materials (e.g. III-V materials) can be substituted.

Figure 4:
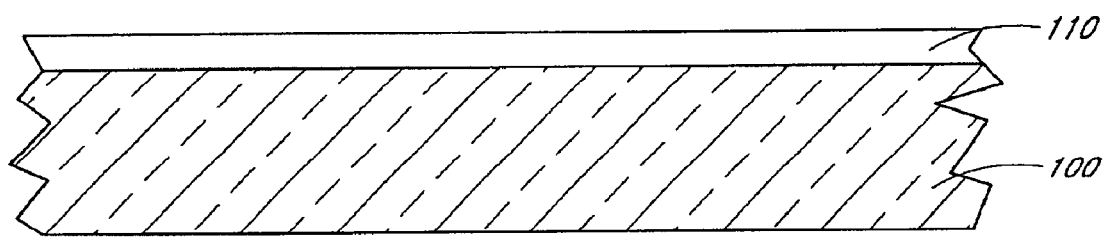
FIG. 4 illustrates the substrate in FIG. 3 after formation of a high k gate dielectric layer over the substrate surface.

With reference now to FIG. 4, a high k dielectric layer 110, preferably comprising zirconium oxide ($ZrO_2$), is formed over the substrate 100. In accordance with the preferred embodiment, whereby the high k material 110 is formed in a specialized ALD chamber, the workpiece is typically removed from the ALD reactor in which the gate dielectric 110 is formed.

Figure 5:
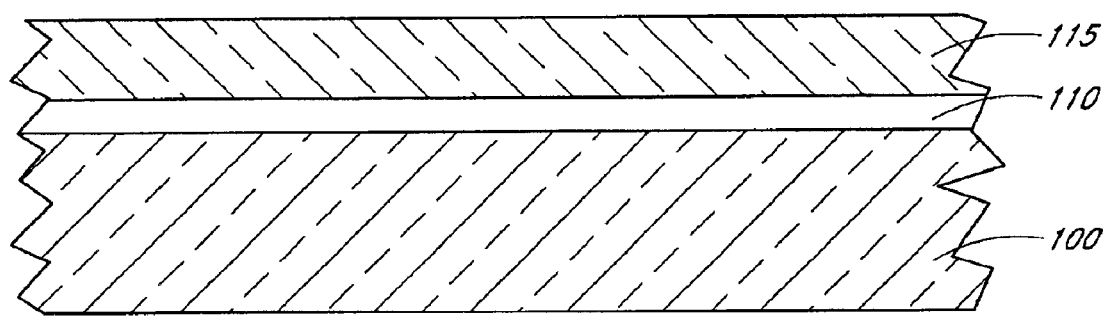
FIG. 5 illustrates a silicon-containing seed layer deposited directly over the gate dielectric layer of FIG. 4.

Referring now to FIG. 5, a seed layer 115 is deposited directly over the cleaned surface of the gate dielectric 110. The deposition preferably takes place within the preferred single wafer CVD reactor of FIG. 1, available under the trade name Epsilon™ from ASM America of Phoenix, Ariz. Other suitable deposition chambers can also be employed.

The wetting layer 115 is characterized by provision of rapid incubation of the material deposited thereupon, as well as electrical and chemical compatibility with the overlying layer. Most preferably, the wetting layer 115 is generally indistinguishable from the overlying bulk layer 120 (FIG. 6, discussed below), and so is typically not apparent in the final structure (FIG. 7).

Figure 6:
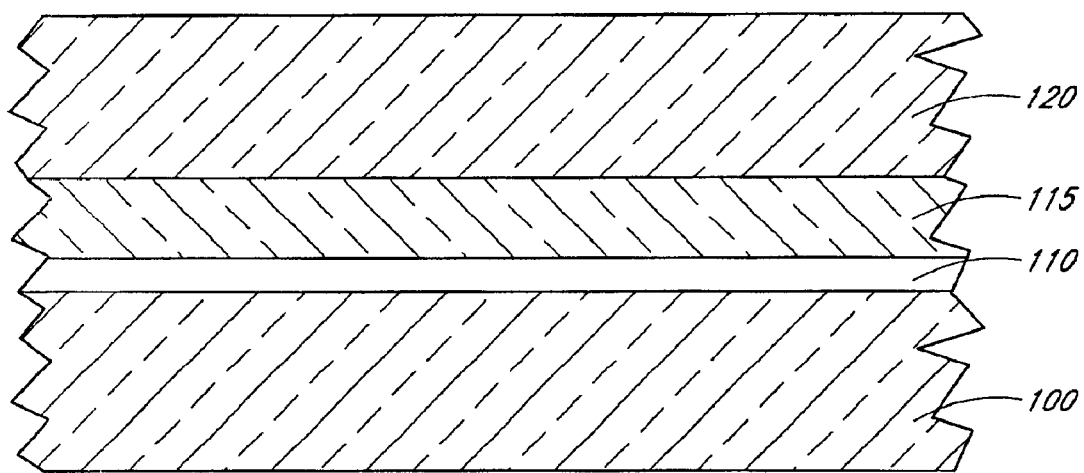
FIG. 6 illustrates a silicon-containing bulk layer deposited directly over the gate layer of FIG. 5.

Referring now to FIG. 6, a bulk silicon-containing layer 120 is deposited over the silicon-containing seed layer 115. As noted above, the bulk layer 120 can comprise electrically doped polysilicon or poly-SiGe.

Figure 7:
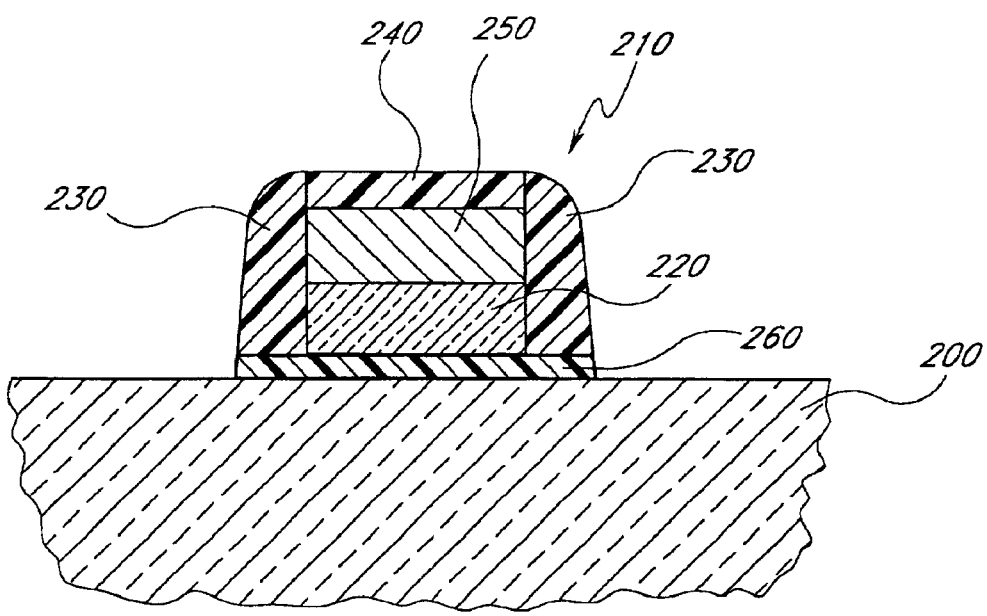
FIG. 7 is a schematic section of a transistor gate stack constructed in accordance with preferred embodiments of the invention.

FIG. 7 illustrates a transistor gate incorporating the above-described layers. In particular, a semiconductor substrate 200 is shown with a transistor gate stack 210 formed thereover. In the illustrated embodiment, the substrate 200 comprises an upper portion of a single-crystal silicon wafer, though the skilled artisan will appreciate that the substrate can also comprise other semiconductor materials.

The gate stack 210 includes a polysilicon or poly-SiGe gate electrode layer 220, comprising the seed layer and bulk layer of the above-described process. Sidewall spacers 230 and an insulating layer 240 protect and isolate the electrode 220 in a conventional manner. Also illustrated is a more highly conductive strapping layer 250, typically including metal, over the silicon-containing gate electrode layer 220. The strap 250 facilitates rapid signal propagation among transistor gates across the wafer, connecting the gates to logic circuits.

A high k gate dielectric 260, formed by the exemplary processes described above, separates the gate electrode 220 from the substrate 200. As noted in the Background section above, the gate dielectric 260 is a critical feature in the pursuit of denser and faster circuits.

While the described embodiments above include altering deposition conditions between seed phase and bulk phase of the gate electrode deposition, the skilled artisan will appreciate that the advantages of the processes described herein, namely avoiding reduction of high k dielectrics, can be obtained by continuing conditions of the seed phase through the bulk phase of deposition. Even if the conditions are altered, as preferred, for improved deposition rates in the bulk phase, at least some of the conditions that minimize dielectric reduction are continued. For example, in one embodiment, nitrogen carrier gas is employed in place of hydrogen carrier gas (which is normally employed in single-wafer deposition tools) throughout the gate electrode deposition. In another embodiment, a higher order silane, such as disilane and preferably trisilane, is employed throughout the gate electrode deposition. Non-hydrogen carrier gases can also be used with a higher order silane, and will even increase deposition rates. However, in view of the lower hydrogen content (higher Si:H ratio) in the higher order silanes, the lower deposition temperatures and the higher inherent deposition rate (all other things being equal), it is preferred to use hydrogen gas ($H_2$) with higher order silanes for better process control. Due to the other advantages of higher order silanes, the use of hydrogen will not too adversely affect the quality of the interface between the high k layer and silicon-containing material.

Figure 8:
FIGS. 8–14 are reproductions of scanning electron micrographs (SEMs) of gate electrode layers, deposited in accordance with preferred embodiments of the present invention, over high k dielectric layers.
Figure 9:
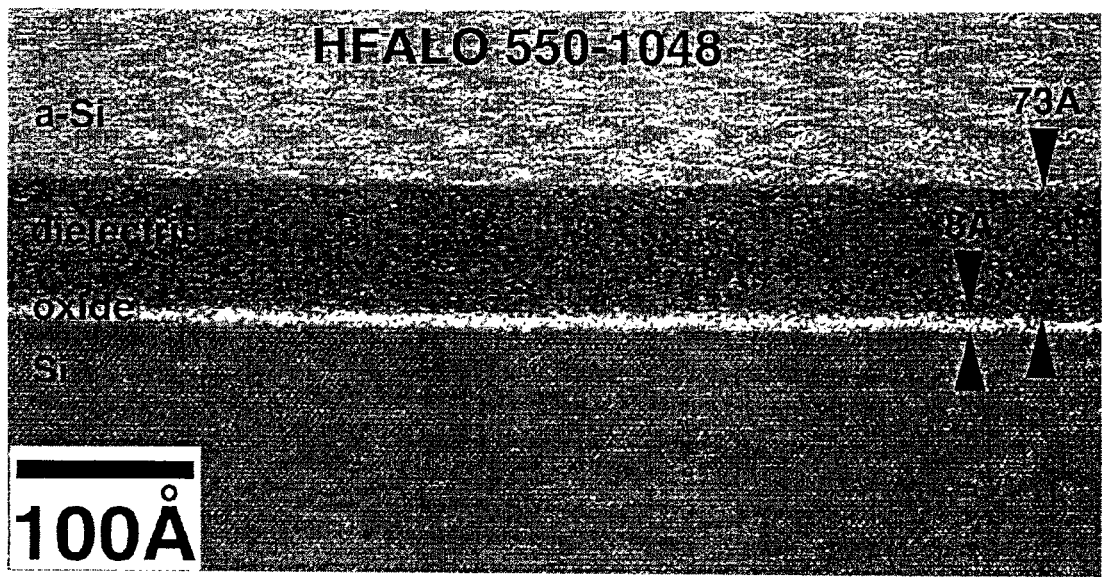

Accordingly, in one embodiment, FIGS. 8–9 illustrate deposition using a higher order silane over a high k material. Namely, amorphous silicon ($\alpha$-Si) was deposited over a high k material comprised of a mixture of hafnium oxide ($HfO_2$) and aluminum oxide ($Al_2O_3$) that was formed by atomic layer deposition. A silicon-containing layer, namely amorphous silicon, was deposited under the following conditions: trisilane flow established by flowing 100 sccm $H_2$ through a bubbler filled with trisilane; 40 Torr chamber pressure; 10 slm $H_2$ carrier gas; and a substrate temperature of 550° C.; deposition conducted for five minutes. Diborane ($B_2H_6$) was also provided to dope the layer with boron in situ. Advantageously, as clearly seen in FIGS. 8 and 9, the interface between the high k material and the overlying silicon-containing material is extremely sharp, indicating no formation of metal silicates from reduction of the high k material.

With reference now to FIGS. 10 to 14, a sample prepared in accordance with another example is shown. A silicon-containing layer was deposited over a hafnium oxide ($HfO_2$) high k material under conditions that avoid reduction of the high k material. Namely, trisilane was employed under the following conditions: 250 sccm of hydrogen flowed through a bubbler filled with trisilane; 10 Torr chamber pressure; 20 slm $H_2$ carrier flow; a substrate temperature of 575° C.; deposition conducted for 134 seconds. About 1,500 Å of extremely conformal and smooth amorphous silicon resulted.

Figure 10:
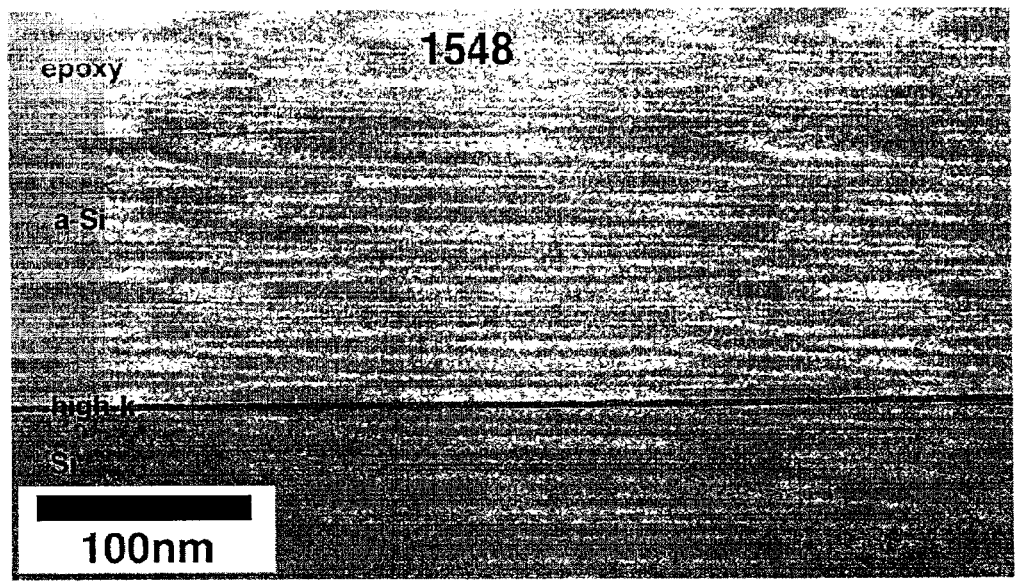
Figure 11:
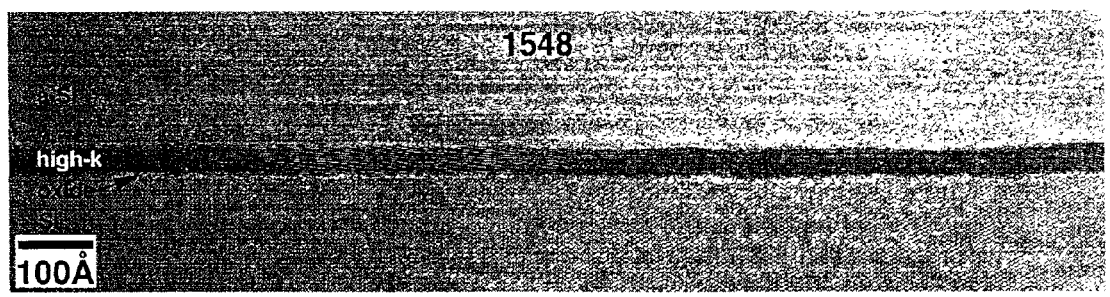
Figure 12:
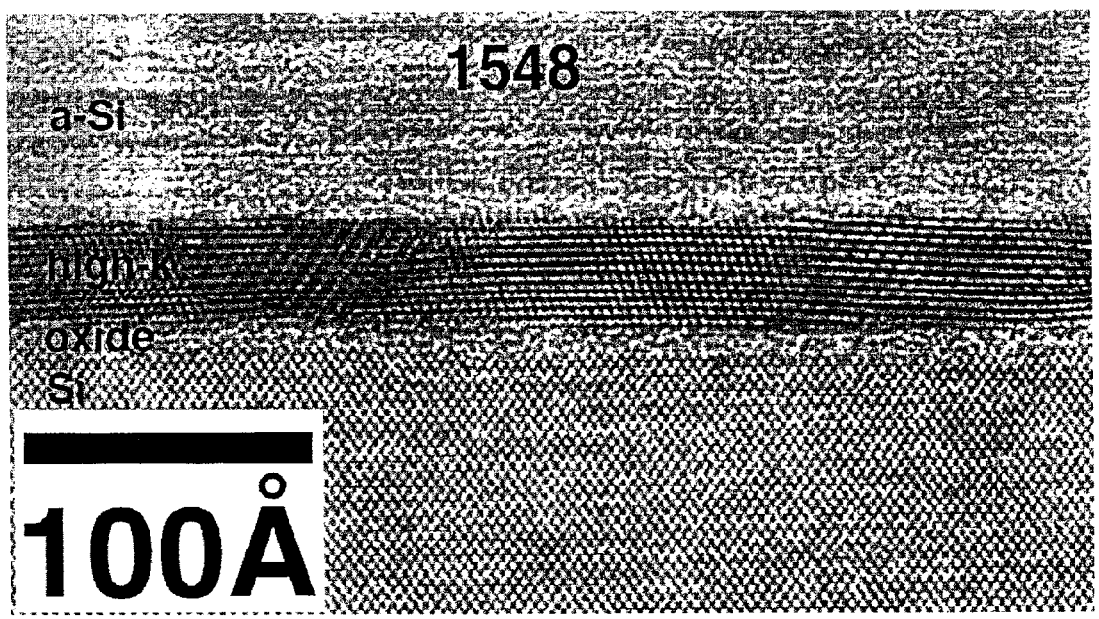
Figure 13:
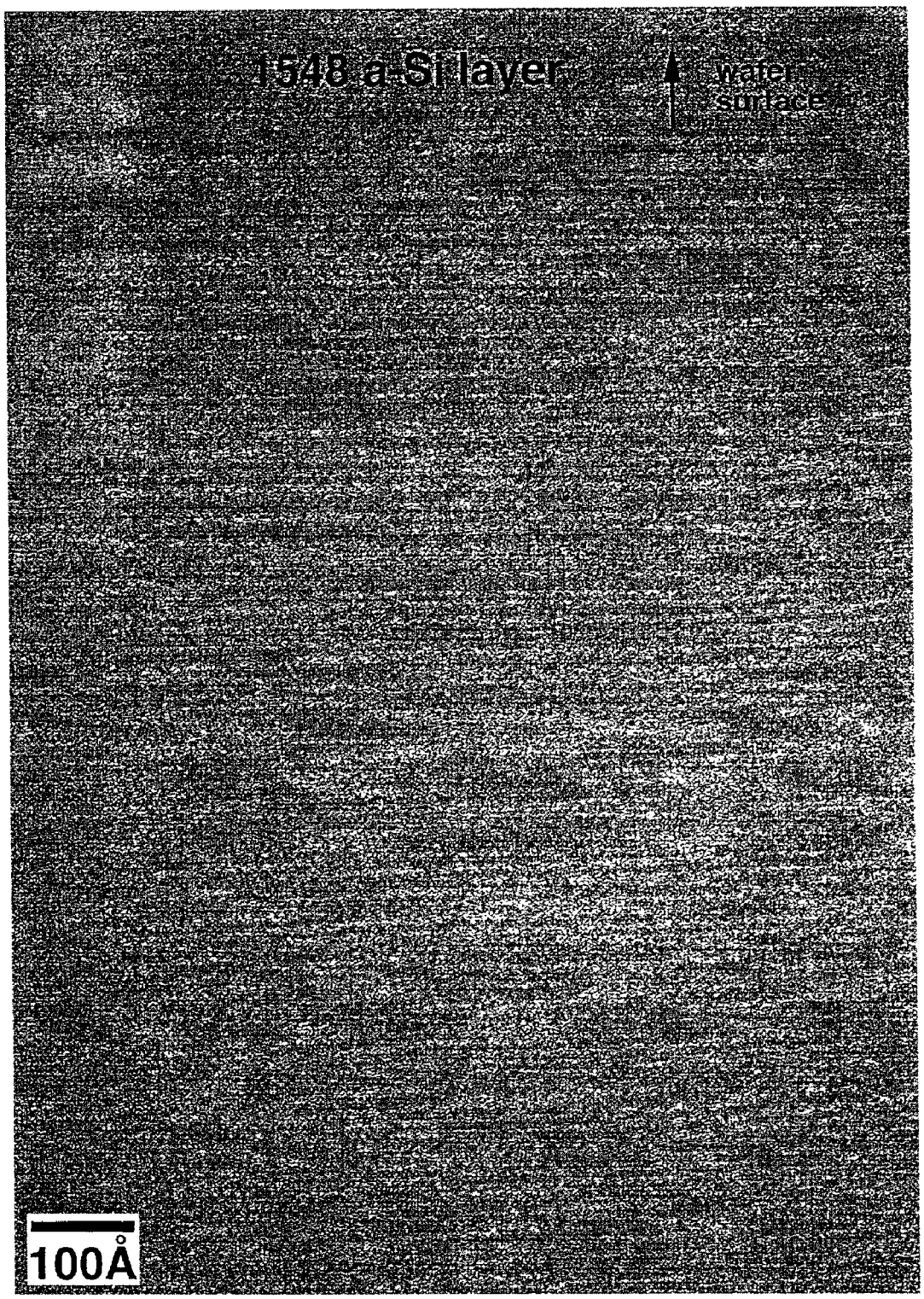
Figure 14:
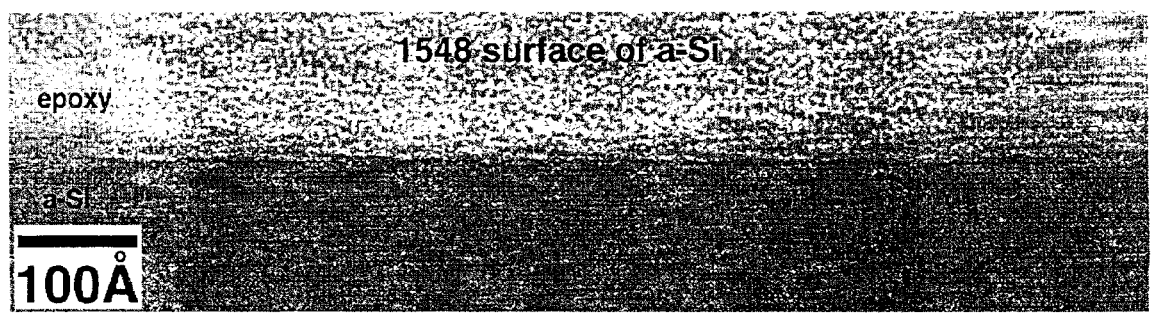

FIGS. 10–12 illustrate the very clean, sharp interface between the amorphous silicon ($\alpha$-Si) and the underlying high dielectric constant material. FIGS. 10 and 13–14 also demonstrate very low surface roughness for the resulting $\alpha$-Si layer.

In other arrangements, trisilane together with a germanium source gas has also been demonstrated to be very effective in depositing silicon germanium layers with excellent uniformity over oxide layers. The disclosure of provisional patent application No. 60/332,696, filed Nov. 13, 2001, from which the present application claims priority, discloses several examples of such deposition. The disclosure of provisional patent application No. 60/332,696 is expressly incorporated by reference herein.

It will be appreciated by those skilled in the art that various omissions, additions and modifications may be made to the processes described above without departing from the scope of the invention. For example, the advantages are not limited to preserving dielectric integrity in gate dielectrics, and can be applied, for example, to the deposition of capacitor electrodes over high k capacitor dielectrics. All such modifications and changes are intended to fall within the scope of the invention, as defined by the appended claims.

We claim:

1. A method of forming a transistor gate stack, comprising:
    forming a high dielectric constant material over a semiconductor substrate;
    depositing a silicon-containing seed layer over the high dielectric constant material under seed phase conditions comprising flowing trisilane; and
    depositing a silicon-containing bulk layer over the seed layer under bulk phase conditions different from the seed phase conditions, the bulk phase conditions selected to result in a higher deposition rate than the seed phase conditions.

2. The method of claim 1, wherein a deposition rate of the seed phase conditions is less than 500 Å/min and the deposition rate of the bulk phase conditions is greater than 500 Å/min.

3. The method of claim 2, wherein the deposition rate of the seed phase conditions is between about 10 Å/min and 100 Å/min.

4. The method of claim 1, wherein the seed phase conditions include a lower temperature than the bulk phase conditions.

5. The method of claim 1, wherein the seed phase conditions include a lower partial pressure than the bulk phase conditions.

6. The method of claim 1, wherein the seed phase conditions include supplying a non-hydrogen carrier gas with the trisilane.

7. The method of claim 6, wherein the bulk phase conditions include supplying a non-hydrogen carrier gas with a silicon source gas.

8. The method of claim 1, wherein the seed layer and the bulk layer form a silicon-germanium gate stack.

9. The method of claim 1, wherein the bulk layer is in situ electrically doped.

10. The method of claim 1, wherein depositing comprises heating the substrate to a temperature between about 400° C. and 600° C.

11. The method of claim 1, wherein the partial pressure of the trisilane in the seed phase conditions is between about 1 mTorr and 1 Torr.

12. The method of claim 11, wherein the seed phase conditions include flowing an inert, non-hydrogenated carrier gas.

13. The method of claim 12, wherein the carrier gas comprises nitrogen.

14. The method of claim 12, wherein the bulk phase conditions also comprise flowing the inert, non-hydrogenated carrier gas.

15. The method of claim 1, wherein the high dielectric constant material is selected from the group consisting of zirconium oxide, hafnium oxide, tantalum oxide, aluminum oxide, barium strontium titanate, strontium bismuth tantalate, and lanthanide oxides.

16. The method of claim 15, wherein high dielectric constant material comprises zirconium oxide.

17. A method of forming a structure in an integrated circuit, comprising:
    forming a layer of high dielectric constant material; and
    depositing an electrode material including a silicon-containing seed layer, over the layer of high dielectric constant material by flowing a silicon source gas comprising trisilane.

18. The method of claim 17, wherein depositing the electrode material further comprise flowing a germanium source gas.

19. The method of claim 17, wherein depositing comprises maintaining a reaction chamber pressure between about 1 Torr and 100 Torr.

20. The method of claim 19, wherein the reaction chamber pressure is maintained between about 10 Torr and 80 Torr.

21. The method of claim 17, wherein depositing comprises maintaining a substrate temperature between about 300° C. and 650° C.

22. The method of claim 21, wherein the substrate temperature is maintained between about 400° C. and 600° C.

23. The method of claim 22, wherein the substrate temperature is maintained between about 450° C. and 575° C.

24. The method of claim 17, wherein forming the layer of high dielectric constant material comprises an atomic layer deposition process.

25. The method of claim 24, wherein the high dielectric constant material is selected from the group consisting of zirconium oxide, hafnium oxide, tantalum oxide, aluminum oxide, barium strontium titanate, strontium bismuth tantalate, and lanthanide oxides.

26. The method of claim 24, wherein the high dielectric constant material comprises a mixture of metal oxides.

27. The method of claim 26, wherein the mixture comprises hafnium oxide and aluminum oxide.

28. A method of forming a silicon-containing material over a high dielectric constant material, comprising:
    loading a substrate into a single-substrate reaction chamber;
    depositing a silicon-containing seed layer over a high dielectric constant layer on the substrate by flowing a silicon source gas comprising trisilane without flowing hydrogen.

29. The method of claim 28, wherein depositing comprises a seed phase conducted at a first temperature and a bulk phase conducted at a higher temperature.

30. The method of claim 29, wherein the seed phase comprises maintaining a temperature of the substrate between about 400° C. and 650° C.

31. The method of claim 28, wherein depositing comprises flowing nitrogen as a carrier gas for the silicon source gas.

32. The method of claim 31, wherein the silicon source gas further comprises silane.

33. The method of claim 28, wherein depositing comprises flowing a carrier gas comprising a noble gas along with the silicon source gas.

34. The method of claim 28, wherein depositing comprises maintaining a temperature between about 300° C. and 800° C.

35. The method of claim 1, wherein the high dielectric constant material is a metal oxide.

36. The method of claim 1, wherein the high dielectric constant material is a lanthanide oxide.

37. The method of claim 17, wherein the high dielectric constant material is selected from the group consisting of zirconium oxide, hafnium oxide, tantalum oxide, aluminum oxide, barium strontium titanate, strontium bismuth tantalate, and lanthanide oxides.

38. The method of claim 17, wherein the high dielectric constant material is a metal oxide.

39. The method of claim 17, wherein the high dielectric constant material is a lanthanide oxide.

40. The method of claim 28, wherein the high dielectric constant material is selected from the group consisting of zirconium oxide, hafnium oxide, tantalum oxide, aluminum oxide, barium strontium titanate, strontium bismuth tantalate, and lanthanide oxides.

41. The method of claim 28, wherein the high dielectric constant material is a metal oxide.

42. The method of claim 28, wherein the high dielectric constant material is a lanthanide oxide.

* * * * *